(12) United States Patent
Wagoner

(10) Patent No.: US 8,310,796 B2
(45) Date of Patent: Nov. 13, 2012

(54) METHODS AND SYSTEMS FOR OPERATING POWER CONVERTERS

(75) Inventor: Robert Gregory Wagoner, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/182,183

(22) Filed: Jul. 13, 2011

(65) Prior Publication Data

US 2012/0051106 A1   Mar. 1, 2012

(51) Int. Cl.
*H02H 3/20* (2006.01)
*H02H 9/04* (2006.01)
*H02H 5/04* (2006.01)

(52) U.S. Cl. ........................... 361/91.1; 361/103
(58) Field of Classification Search ............ 361/103, 361/91.1
See application file for complete search history.

(56) References Cited

U.S. PATENT DOCUMENTS

| | | | |
|---|---|---|---|
| 3,474,963 A * | 10/1969 | Buiting et al. | 236/68 B |
| 7,920,391 B1 | 4/2011 | Vinciarelli | |
| 7,932,708 B2 | 4/2011 | Liu | |
| 2006/0044859 A1 | 3/2006 | Afzal et al. | |
| 2007/0120535 A1 | 5/2007 | Wallace | |
| 2007/0152730 A1 | 7/2007 | Wagoner et al. | |

* cited by examiner

*Primary Examiner* — Dharti Patel
(74) *Attorney, Agent, or Firm* — James McGinness, Esq.; Armstrong Teasdale LLP

(57) ABSTRACT

A switching circuit for use in a power converter is provided. The switching circuit includes an insulated gate bipolar transistor (IGBT) including a gate terminal, a collector terminal, and an emitter terminal, a gate drive circuit electrically coupled to the gate terminal and configured to switch the IGBT on and off, and, a temperature drift resistant clamp circuit electrically coupled between the gate terminal and the collector terminal of the IGBT, the temperature drift resistant clamp circuit configured to maintain a voltage at the collector terminal below a threshold voltage and facilitate reducing the effects of temperature on operation of the switching circuit.

12 Claims, 9 Drawing Sheets

METHODS AND SYSTEMS FOR OPERATING POWER CONVERTERS

BACKGROUND OF THE INVENTION

The subject matter disclosed herein relates generally to power converters, and more specifically, to clamp circuits for transistor switches in power converters.

At least some known power converters utilize switching circuits including transistors capable of handling high currents and voltages. Rapidly switching the transistors on and off in such circuits is beneficial to the quality of the power output of the converter. Due to the charging and/or discharging of the switching circuit during transient operating conditions (i.e., while turning on and off the transistors), switching losses are induced. To reduce switching losses and improve power output, it is beneficial to maintain a relatively high voltage at collector terminals of the transistors.

Transistors in at last some known power converters have operating limits, which, if exceeded, may damage the transistor and/or other components in the power converter. Accordingly, to operate transistors within an acceptable range, at least some known power converters utilize a voltage clamp circuit, such that if the voltage at the collector terminal exceeds a certain amount, the voltage clamp circuit limits a peak voltage between the collector terminal and the emitter terminal of the transistor. Due to part-to-part variation and temperature variation, however, at least some known voltage clamp circuits have a relatively wide range of operation. That is, the precise voltage at which the voltage clamp circuit will shut off the switching circuit may vary significantly depending on the components in the voltage clamp circuit and the temperature of those components. Accordingly, in at least some known switching circuits, to avoid risking operation of the transistor above the operating limits, the switching circuit must be operated at voltage levels substantially below the operating limits, increasing turn off losses and reducing power output of the converter.

BRIEF DESCRIPTION OF THE INVENTION

In one aspect, a switching circuit for use in a power converter is provided. The switching circuit includes an insulated gate bipolar transistor (IGBT) including a gate terminal, a collector terminal, and an emitter terminal, a gate drive circuit electrically coupled to the gate terminal and configured to switch the IGBT on and off, and, a temperature drift resistant clamp circuit electrically coupled between the gate terminal and the collector terminal of the IGBT, the temperature drift resistant clamp circuit configured to maintain a voltage at the collector terminal below a threshold voltage and facilitate reducing the effects of temperature on operation of the switching circuit.

In another aspect, a power generation system is provided. The power generation system includes a power generator, and, a power converter electrically coupled to the power generator, the power converter configured to convert power generated by the generator and supply the converted power to a load. The power converter includes at least one switching circuit that includes an insulated gate bipolar transistor (IGBT) having a gate terminal, a collector terminal, and an emitter terminal, a gate drive circuit electrically coupled to the gate terminal and configured to switch the IGBT on and off, and, a temperature drift resistant clamp circuit electrically coupled between the gate terminal and the collector terminal of the IGBT, the temperature drift resistant clamp circuit configured to maintain a voltage at the collector terminal below a threshold voltage and facilitate reducing the effects of temperature on operation of the switching circuit.

In yet another aspect, a method for reducing the effects of temperature on a switching circuit for use in a power converter is provided. The method includes providing an insulated gate bipolar transistor (IGBT) including a gate terminal, a collector terminal, and an emitter terminal, coupling a gate drive circuit to the gate terminal, the gate drive circuit configured to switch the IGBT on and off, and, coupling a temperature drift resistant clamp circuit between the gate terminal and the collector terminal of the IGBT, the temperature drift resistant clamp circuit configured to maintain a voltage at the collector terminal below a threshold voltage and facilitate reducing the effects of temperature on operation of the switching circuit.

DETAILED DESCRIPTION OF THE INVENTION

The methods and systems described herein include a temperature drift resistant clamp circuit that facilitates reducing the effects of temperature on operation of a power converter switching circuit. In one embodiment, the temperature drift resistant clamp circuit includes at least one zener diode and a temperature compensation circuit. In another embodiment, the temperature drift resistant clamp circuit includes a backwards diode component and a temperature compensated voltage source. Because the effects of temperature on the switching circuit are reduced by using the temperature drift resistant clamp circuit, the switching circuit can be operated at a higher voltage, decreasing switching losses and increasing a total power output of the power converter.

Figure 1:
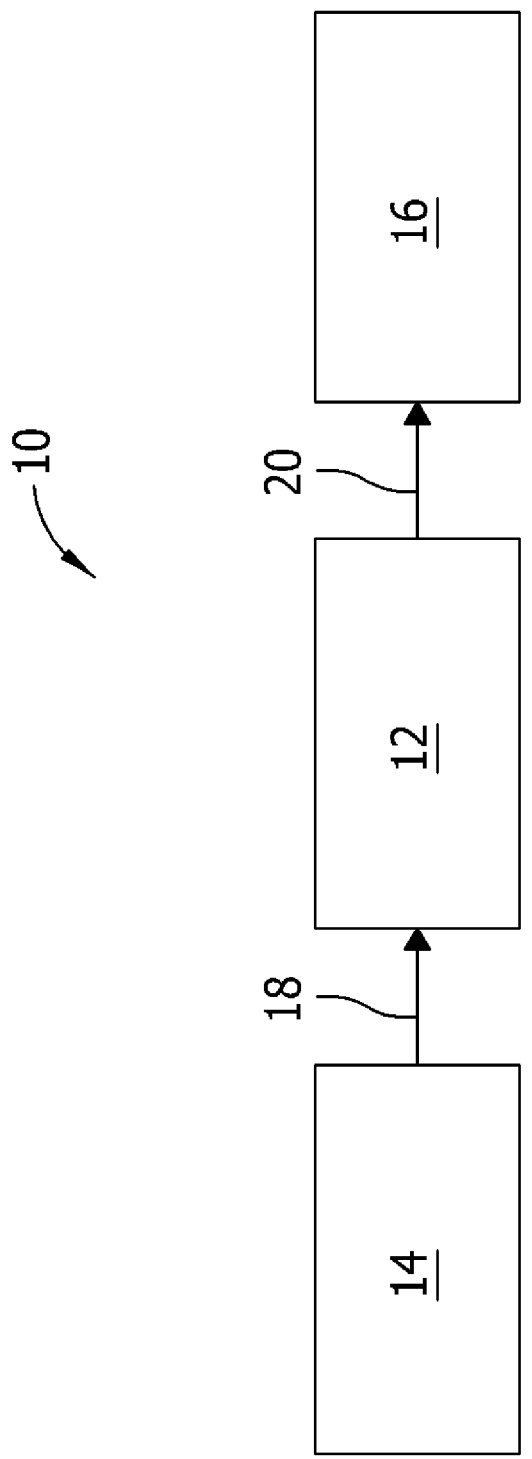
FIG. 1 is a block diagram of an exemplary power generation system.

FIG. 1 is a block diagram of an exemplary power generation system 10 that includes a power converter 12. Power generation system 10 is configured for supplying power from a generator 14 to a load 16. Although illustrated as including one power converter 12, any suitable number of converters may be included that enables power generation system 10 to function as described herein.

In the exemplary embodiment, generator 14 is configured to generate an alternating current (AC) power. In one embodiment, generator 14 is a wind turbine generator. Alternatively, generator 14 is any power generating device that enables power generation system 10 to function as described herein. The AC power generated by generator 14 is provided to power converter 12 as AC input power 18. Power converter 12 receives and converts AC input power 18 to an output power 20, and output power 20 is provided to load 16. Load 16 may include, but is not limited to including, motors, power grids, and/or resistive loads.

In the exemplary embodiment, AC input power 18 has a variable frequency, and power converter 12 converts the variable frequency AC input power 18 to a fixed frequency output power 20. Alternatively, power converter 12 converts power in any manner that enables power generation system 10 to function as described herein.

Figure 2:
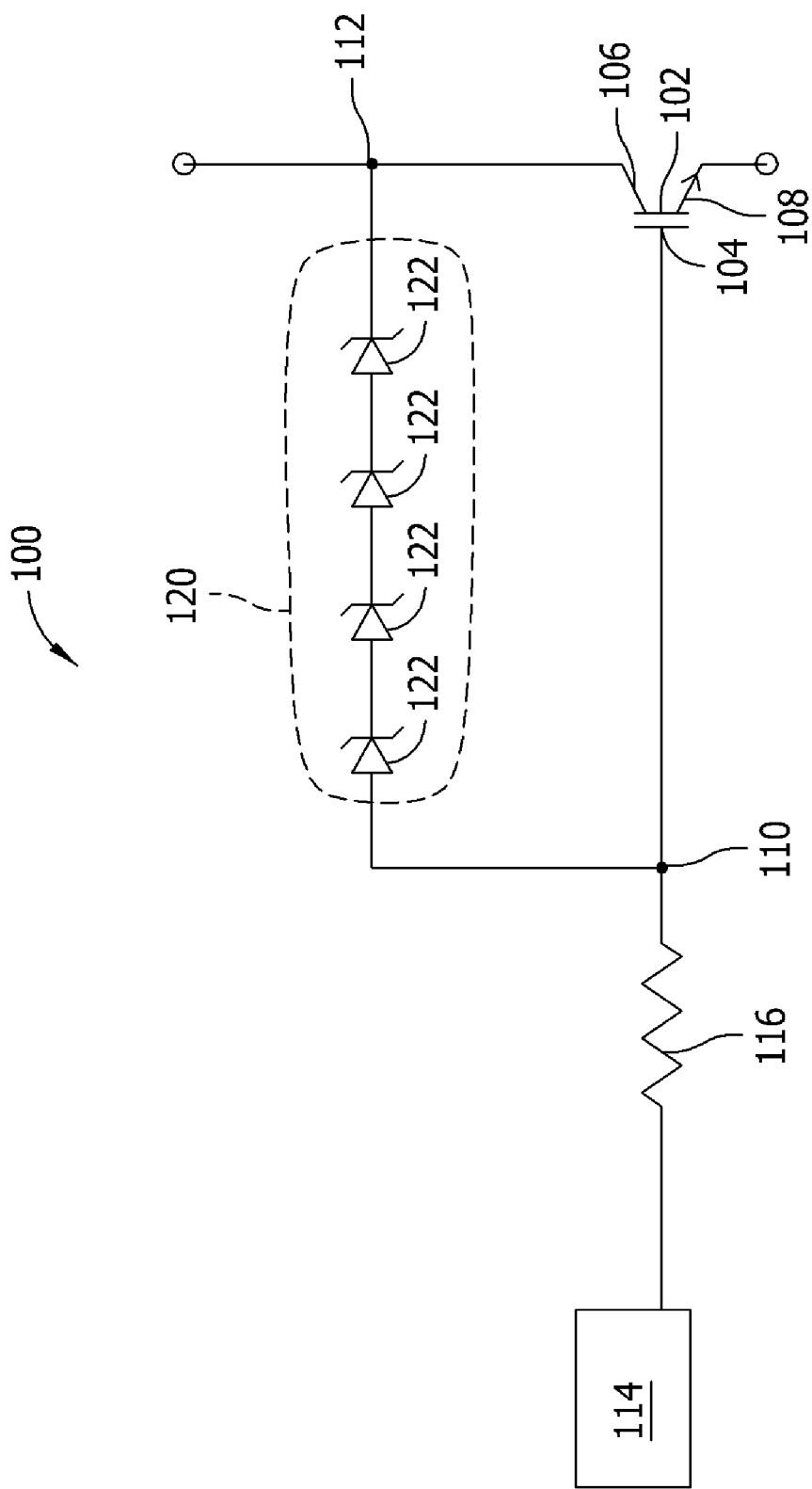
FIG. 2 is a schematic view of a known switching circuit.

FIG. 2 is a schematic diagram of a known switching circuit 100 that may be used in a power converter, such as power converter 12 (shown in FIG. 1). Switching circuit 100 includes an insulated gate bipolar transistor (IGBT) 102 that includes a gate terminal 104, a collector terminal 106, and an emitter terminal 108. Gate terminal 104 is electrically coupled to a node 110, and collector terminal 106 is electrically coupled to a node 112. A gate drive circuit 114 is electrically coupled to node 110 through a gate resistor 116.

The gate drive circuit 114 generates a positive voltage signal having a positive voltage for turning on the IGBT 102. More specifically, the gate drive circuit 114 generates a positive voltage signal at gate terminal 104 to turn on IGBT 102. Further, to turn off IGBT 102, gate drive circuit 114 stops generating the positive voltage signal.

During operation of power converter 12, IGBT 102 is switched on and off repeatedly. Due to the charging and/or discharging of switching circuit 100 during transient operating conditions (i.e., while turning on and off IGBT 102), switching losses are induced. To reduce switching losses, it is beneficial to maintain a relatively high voltage at collector terminal 106 of IGBT 102. Further, in general, the higher the voltage at collector terminal 106, the greater the output of power converter 12.

However, IGBT 102 has a threshold operating voltage, which, if exceeded, may cause damage to IGBT 102 and/or other components in switching circuit 100 and/or power converter 12. For example, in one embodiment, IGBT 102 is rated for operation below 1700 Volts (V). That is, if a voltage between gate terminal 104 and collector terminal 106 is greater that 1700V, IGBT 102 may malfunction and/or become damaged. Accordingly, switching circuit 100 includes a voltage clamp circuit 120 to control the voltage between gate terminal 104 and collector terminal 106, such that a relatively high voltage is maintained at collector terminal 106 without exceeding the threshold operating voltage.

In the exemplary embodiment, voltage clamp circuit 120 includes four transient voltage suppression (TVS) zener diodes 122 connected in series between node 110 and node 112. Each zener diode 122 has a pre-determined breakdown voltage. If the total breakdown voltage for zener diodes 122 is exceeded, current will flow from collector terminal 106 to gate terminal 104. As such, voltage clamp circuit 120 operates to apply a signal to gate terminal 104 when the total breakdown voltage is exceeded. This reduces a rate of change of current (di/dt) at collector terminal 106, limiting a peak voltage between collector terminal 106 and emitter terminal 108.

However, the actual breakdown voltage of zener diodes 122, and accordingly, the operation of voltage clamp circuit 120, may vary significantly with temperature. For example, in one embodiment, zener diodes 122 may experience a 12% variation in their breakdown voltage because of changes in temperature. Thus, while it is beneficial to operate switching circuit 100 at a relatively high voltage with respect to collector terminal 106, due to the variable operational voltage of voltage clamp circuit 120 that results from temperature drift, switching circuit 100 is generally operated well below the threshold operating voltage. For instance, when IGBT 102 has a threshold operating voltage of 1700 V and voltage clamp circuit 120 has a 12% variance in operation due to temperature drift, switching circuit 100 may be operated at 1420 to 1590 V. Accordingly, the more resistant the voltage clamp circuit 120 is to changes in temperature (i.e., temperature drift), the higher the voltage switching circuit 100 can be operated at with respect to collector terminal 106 without risking exceeding the threshold operating voltage of IGBT 102.

Figure 3:
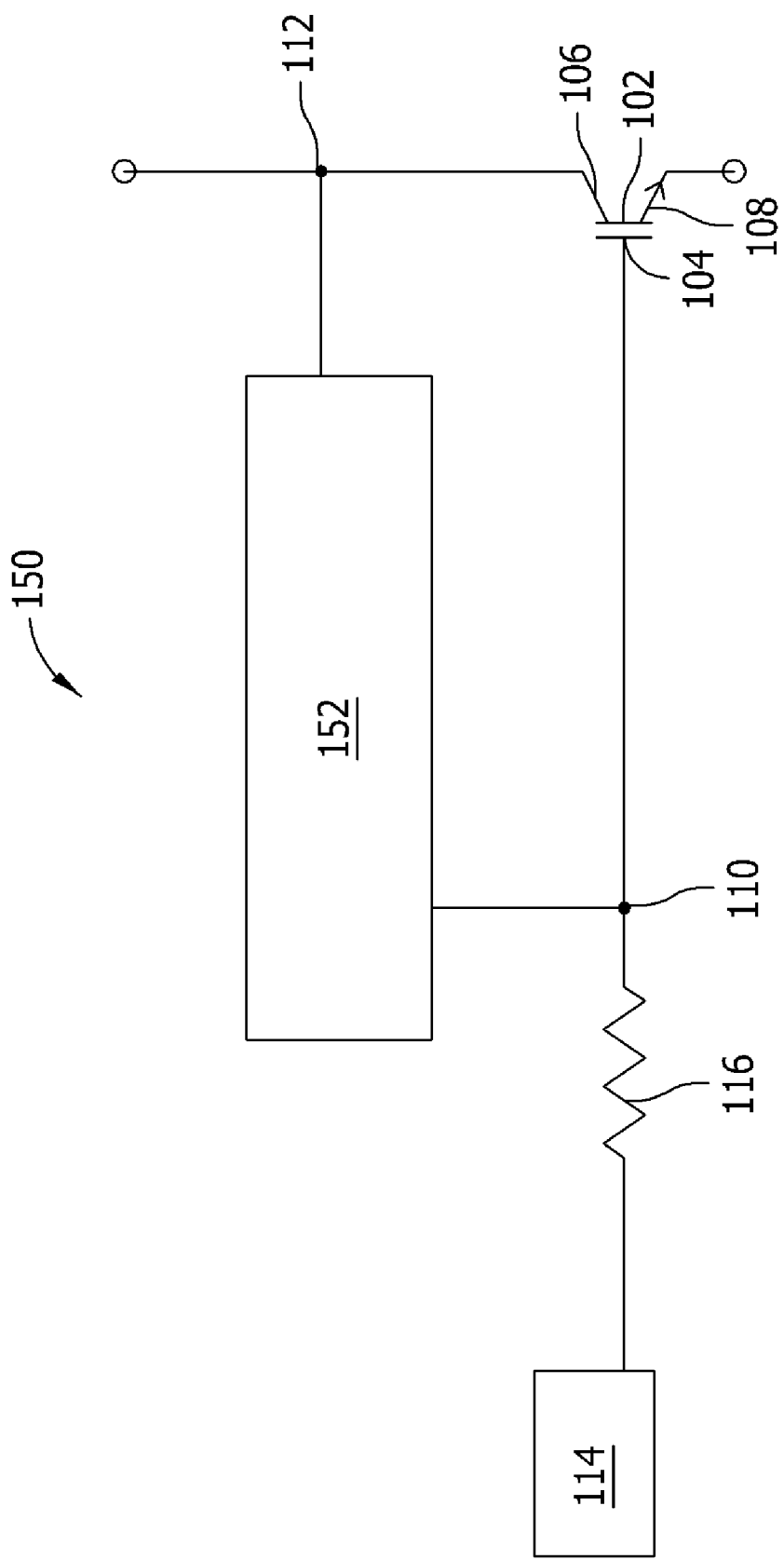
FIG. 3 is a schematic diagram of an exemplary switching circuit that may be used with the power generation system shown in FIG. 1.

FIG. 3 is a schematic diagram of an exemplary switching circuit 150 that includes a temperature drift resistant clamp circuit 152. Components in switching circuit 150 that are identical to components in switching circuit 100 (shown in FIG. 2) are identified in FIG. 3 using the same reference numerals as used in FIG. 2. Temperature drift resistant clamp circuit 152 facilitates reducing the effects of temperature on the operation of switching circuit 150, as described in detail below. Accordingly, switching circuit 150 may be operated at a higher voltage that is closer to the threshold operating voltage of IGBT 102 than switching circuit 100 (shown in FIG. 2), resulting in reduced switching losses and increased power output. Although only one IGBT 102 is shown in FIG. 2, switching circuit 100 and/or power converter 12 may include any number of IGBTs that enable power converter 12 to function as described herein. In the exemplary embodiment, temperature drift resistant clamp circuit 152 is electrically coupled between node 110 and node 112. That is, temperature drift resistant clamp circuit 152 is coupled between gate terminal 104 and collector terminal 106.

Figure 4:
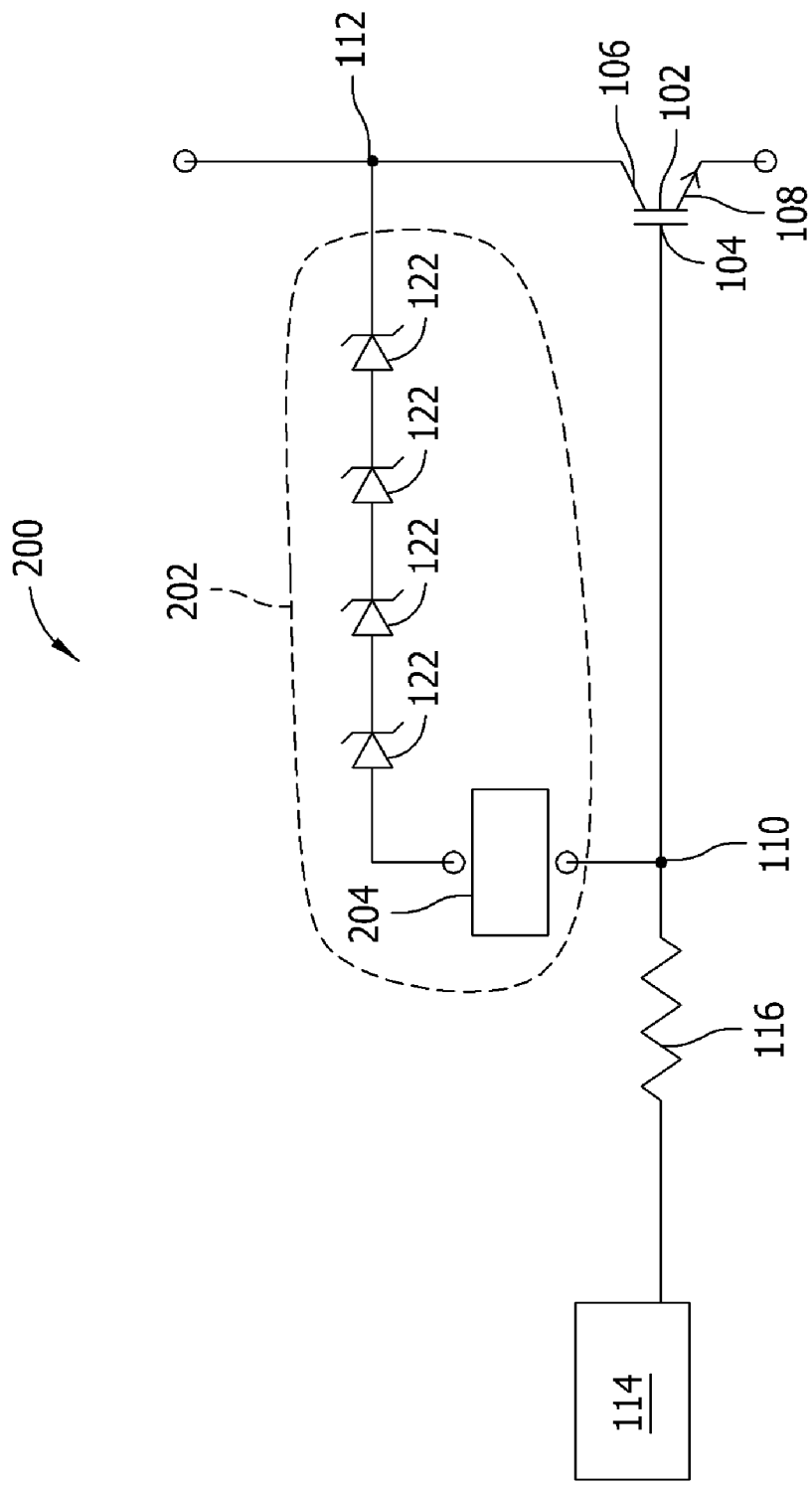
FIG. 4 is a schematic diagram of an exemplary switching circuit that may be used with the power generation system shown in FIG. 1.

FIG. 4 is a schematic diagram of an exemplary switching circuit 200 that includes a temperature drift resistant clamp circuit 202, such as temperature drift resistant clamp circuit 152 (shown in FIG. 3). Components in switching circuit 200 that are identical to components in switching circuits 100 and 150 (shown in FIGS. 2 and 3) are identified in FIG. 4 using the same reference numerals as used in FIGS. 2 and 3. In addition to zener diodes 122, clamp circuit 202 includes a temperature compensation circuit 204. While four zener diodes 122 are illustrated in the exemplary embodiment, temperature drift resistant clamp circuit 202 may include any number of zener diodes that enables temperature drift resistant clamp circuit 202 to function as described herein. In the exemplary embodiment, temperature compensation circuit 204 is electrically coupled between node 110 and zener diodes 122. Temperature compensation circuit 204 facilitates reducing effects of temperature drift on temperature drift resistant clamp circuit 152 and/or switching circuit 200. For example, in some embodiments, temperature drift resistant clamp circuit 202 has a variance in operation due to temperature drift of approximately 6%. Accordingly, switching circuit 200 may be operated at a higher voltage that is closer to the threshold operating voltage of IGBT 102 than switching circuit 100, resulting in reduced switching losses and increased power output.

Figure 5:
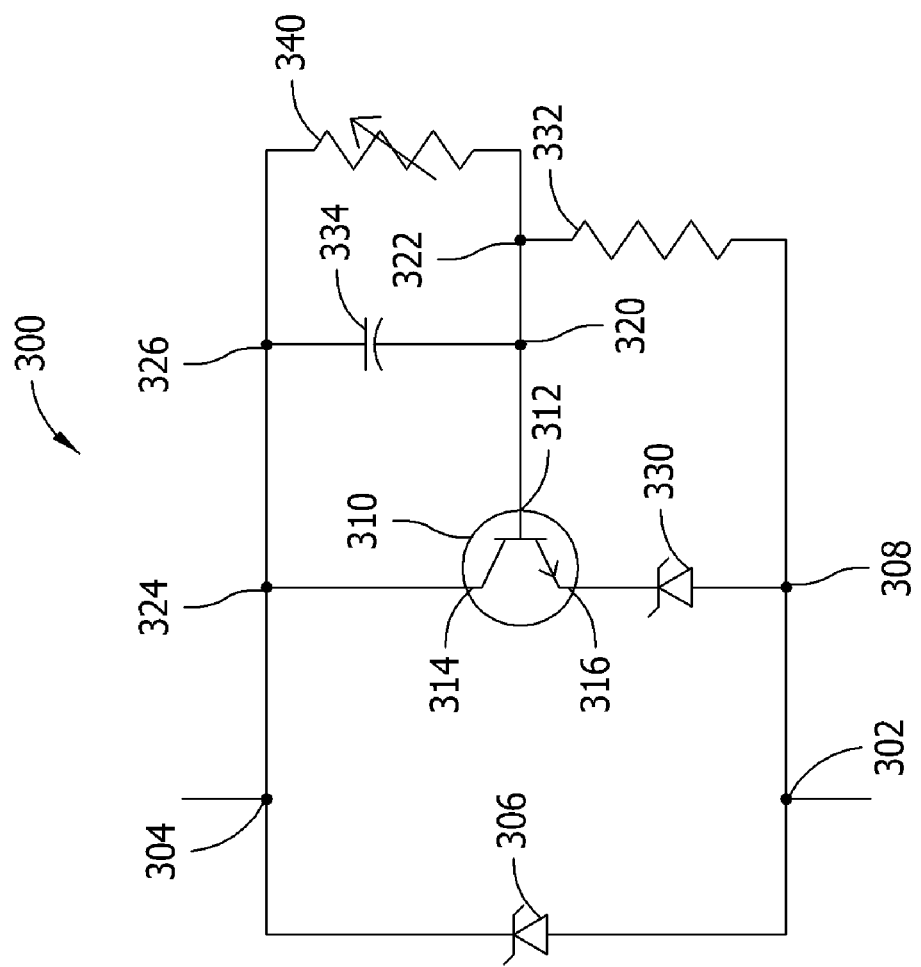
FIG. 5 is a schematic diagram of an exemplary temperature compensation circuit that may be used with the switching circuit shown in FIG. 4.

FIG. 5 is a schematic diagram of an exemplary temperature compensation circuit 300, such as temperature compensation circuit 204 (shown in FIG. 4). Temperature compensation circuit 300 includes a node 302 electrically coupled to gate terminal 104 (shown in FIG. 4), and a node 304 electrically coupled to zener diodes 122 (shown in FIG. 4). In one embodiment, node 302 is the same as node 110 (shown in FIG. 4). A first zener diode 306 is coupled between node 302 and node 304, and a node 308 is electrically coupled to node 302.

Temperature compensation circuit 300, in the exemplary embodiment, further includes a bipolar junction transistor (BJT) 310 including a base terminal 312, a collector terminal 314, and an emitter terminal 316. Base terminal 312 is electrically coupled to nodes 320 and 322, and collector terminal 314 is electrically coupled to node 304, as well as nodes 324 and 326. A second zener diode 330 is electrically coupled between node 308 and emitter terminal 316.

In the exemplary embodiment, a resistor 332 is coupled between node 308 and node 322, and a capacitor 334 is coupled between node 320 and node 326. Further, a thermistor 340 is coupled between node 322 and node 326. Thermistor 340 compensates changes in the breakdown voltages of zener diodes 122 due to temperature drift. More specifically, thermistor 340 and resistor 332 form a voltage divider that sets a voltage level at base terminal 312 of BJT 310. Thermistor 340 has a negative temperature coefficient, such that its resistance decreases as the temperature increases. The breakdown voltage of zener diodes 122 has a positive temperature coefficient, such that its voltage increases as the temperature increases. In the exemplary embodiment, the values of the components of the voltage divider formed by thermistor 340 and resistor 332 can be set to create a reference voltage that drifts with temperature equal and opposite to the breakdown voltage of zener diodes 122, resulting in temperature drift resistant clamp circuit 202 having minimal temperature drift.

FIG. 5 illustrates a specific example of temperature compensation circuit 204 (shown in FIG. 4). It should be noted that temperature compensation circuit 300 is exemplary only and does not in any way limit the methods and systems described herein. That is, temperature compensation circuit 204 may include any components and/or arrangement of components that facilitate reducing the effects of temperature drift in switching circuit 200.

Figure 6:
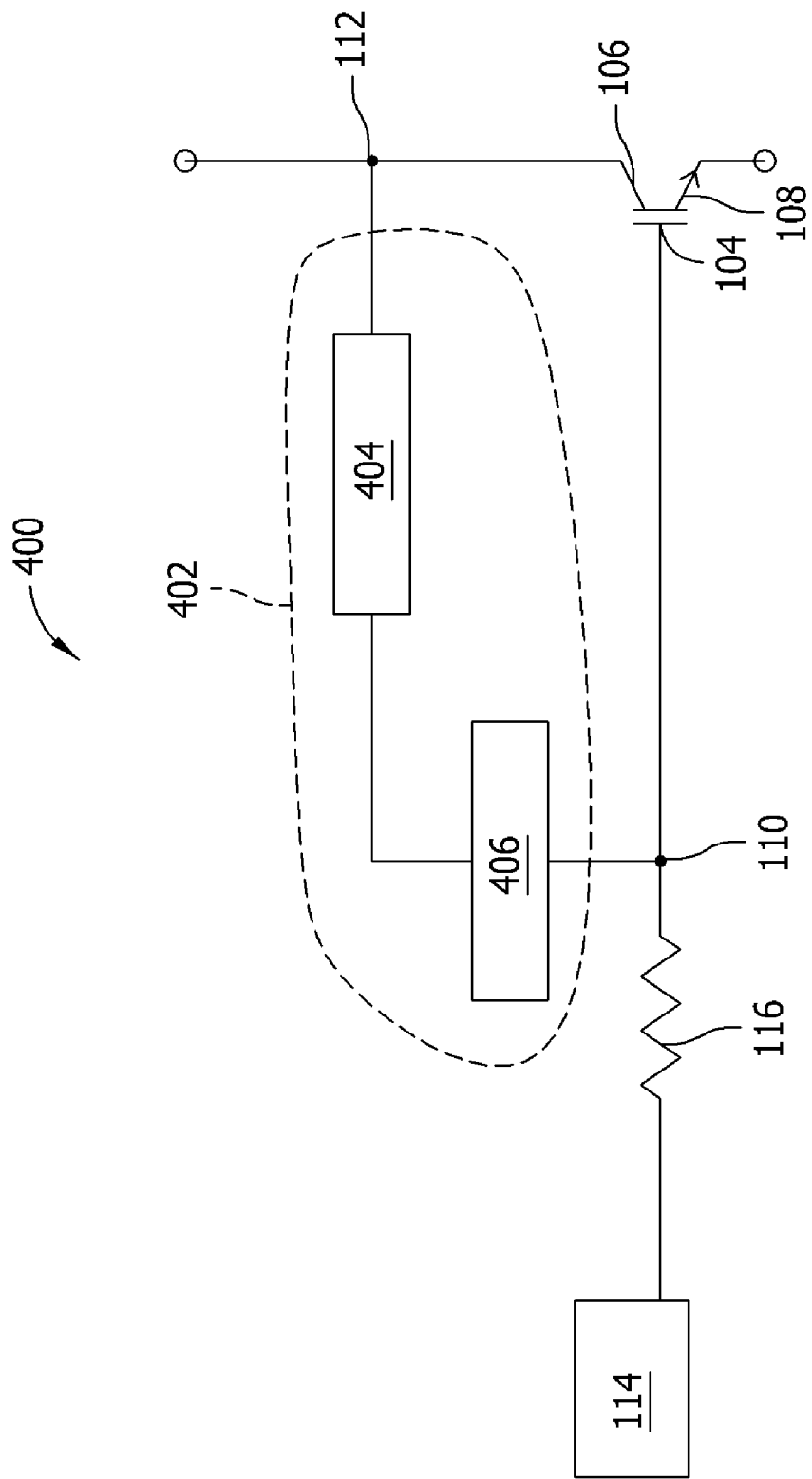
FIG. 6 is a schematic diagram of an exemplary switching circuit that may be used with the power generation system shown in FIG. 1.

FIG. 6 is a schematic diagram of an exemplary switching circuit 400 that includes a temperature drift resistant clamp circuit 402, such as temperature drift resistant clamp circuit 152 (shown in FIG. 3). Components in switching circuit 400 that are identical to components in switching circuit 150 (shown in FIG. 3) are identified in FIG. 6 using the same reference numerals as used in FIG. 3. Temperature drift resistant clamp circuit 402 includes a backwards diode component 404 and a temperature compensated voltage source 406. More specifically, backwards diode component 404 and a temperature compensated voltage source 406 are electrically coupled between nodes 110 and 112. Unlike zener diodes 122 (shown in FIG. 2), temperature compensated voltage source 406 is relatively immune to effects due to temperature drift. That is, regardless of the ambient temperature, temperature compensated voltage source 406 performs in substantially the same manner. For example, in some embodiments, temperature drift resistant clamp circuit 402 has a variance in operation due to temperature drift of approximately 3%. Accordingly, switching circuit 400 may be operated at a higher voltage that is closer to the threshold operating voltage of IGBT 102 than switching circuit 100 (shown in FIG. 2), resulting in reduced switching losses and increased power output.

Figure 7:
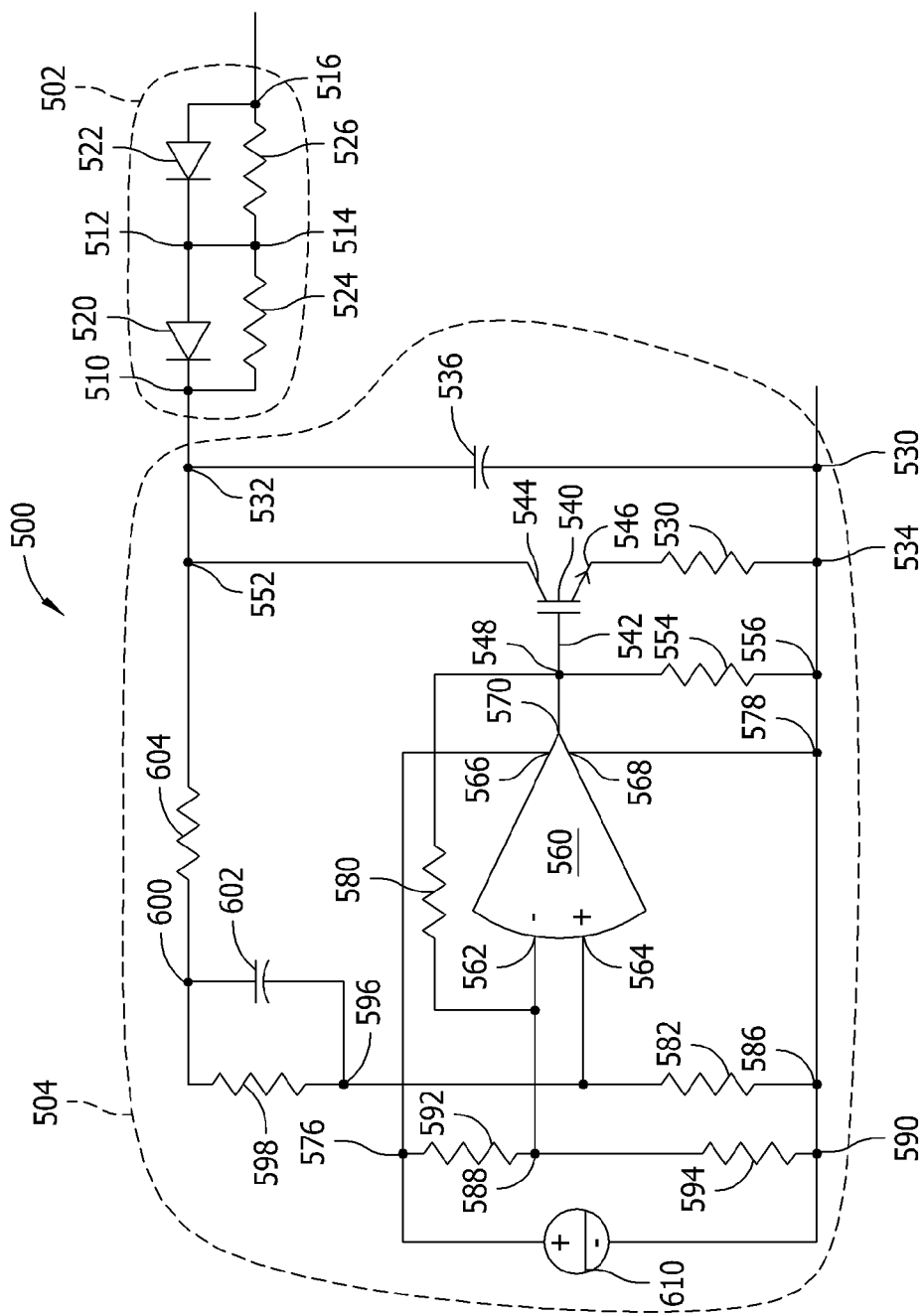
FIG. 7 is a schematic diagram of an exemplary temperature drift resistant clamp circuit that may be used with the switching circuit shown in FIG. 6.

FIG. 7 is a schematic diagram of a temperature drift resistant clamp circuit 500, such as temperature drift resistant clamp circuit 402 (shown in FIG. 4). Clamp circuit 500 includes a backwards diode component 502 and a temperature compensated voltage source 504.

In the exemplary embodiment, backwards diode component 502 includes nodes 510, 512, 514, and 516. Node 512 is electrically coupled to node 514. Node 516 is electrically coupled to collector terminal 106 (shown in FIG. 6). In one embodiment, node 516 is the same as node 112. A first diode 520 is electrically coupled between node 510 and node 512, a second diode 522 is electrically coupled between node 512 and node 516, a first resistor 524 is coupled between node 510 and node 514, and a second resistor 526 is coupled between node 514 and node 516. In operation, backwards diode component 502 behaves similarly to zener diodes 122 (shown in FIG. 2). That is, when a voltage across backwards diode component 502 reaches an effective "breakdown" voltage, current flows through backwards diode component from node 516 to node 510.

Temperature compensated voltage source 504 includes a node 530 that is electrically coupled to gate terminal 104 (shown in FIG. 6). In one embodiment, node 530 is the same as node 110. Node 530 is electrically coupled to nodes 532 and 534. Node 532 is electrically coupled to node 510, connecting temperature compensated voltage source 504 to backwards diode component 502. A first capacitor 536 is electrically coupled between nodes 530 and 532.

In the exemplary embodiment, temperature compensated voltage source 504 includes a bipolar junction transistor (BJT) 540 including a base terminal 542, a collector terminal 544, and an emitter terminal 546. Base terminal 542 is electrically coupled to a node 548, and a first resistor 550 is electrically coupled between emitter terminal 546 and node 534. Collector terminal 544 is electrically coupled to a node 552 that is electrically coupled to node 532. A second resistor 554 is electrically coupled between node 548 and a node 556 that is electrically coupled to node 534.

Temperature compensated voltage source 504 includes an operational amplifier (op-amp) 560 that includes an inverting input 562, a non-inverting input 564, a first supply voltage input 566, a second supply voltage input 568, and an output 570. Inverting input 562 is electrically coupled to a node 572, non-inverting input 564 is electrically coupled to a node 574, first supply voltage input 566 is electrically coupled to a node 576, second supply voltage input 568 is coupled to a node 578 that is electrically coupled to node 556, and output 570 is coupled to node 548. A third resistor 580 is electrically coupled between node 572 and node 548.

A fourth resistor 582 is electrically coupled between node 574 and a node 586 that is electrically coupled to node 578. A node 588 is electrically coupled to node 576, node 572, and a node 590. A fifth resistor 592 is electrically coupled between node 576 and node 588, and a sixth resistor 594 is coupled between node 588 and node 590. Node 574 is also electrically coupled to a node 596. A seventh resistor 598 is electrically coupled between node 596 and a node 600. Further, a second capacitor 602 is electrically coupled in parallel with seventh resistor 598 between node 596 and node 600. An eighth resistor 604 is electrically coupled between node 600 and node 552.

In the exemplary embodiment, a temperature compensated direct current (DC) power source 610 is electrically coupled between node 576 and node 590. DC power source 610 drives temperature compensated voltage source 504. Inverting input 562 of op-amp 560 is used in a feedback loop with third resistor 580, fifth resistor 592, and sixth resistor 594 to regulate the voltage of temperature compensated voltage source 504, based on a signal from temperature compensated DC power source 610, as compared to non-inverting input 564 of op-amp 560 through fourth resistor 582, seventh resistor 598, and eighth resistor 604. An output signal of the op-amp 560 is buffered by a BJT 540 to amplify the current and voltage capability of op-amp 560 to a higher current and voltage capability as required by temperature compensated voltage source 504. Second capacitor 602 is used to increase the frequency response of op-amp 560 to respond faster to transients, and first capacitor 536 is used to stabilize the output voltage of the circuit to respond faster to transients. The output voltage of the circuit is based on temperature compensated DC power source 610, and hence the output voltage of temperature compensated voltage source 504 will have a temperature drift equal to that of the temperature compensated DC power source 610.

FIG. 7 illustrates a specific example of temperature drift resistant clamp circuit 402 (shown in FIG. 6). It should be noted that temperature drift resistant clamp circuit 500 is exemplary only and does not in any way limit the methods and systems described herein. That is, temperature drift resistant clamp circuit 402 may include any components and/or arrangement of components that facilitate reducing the effects of temperature drift in switching circuit 400.

Figure 8:
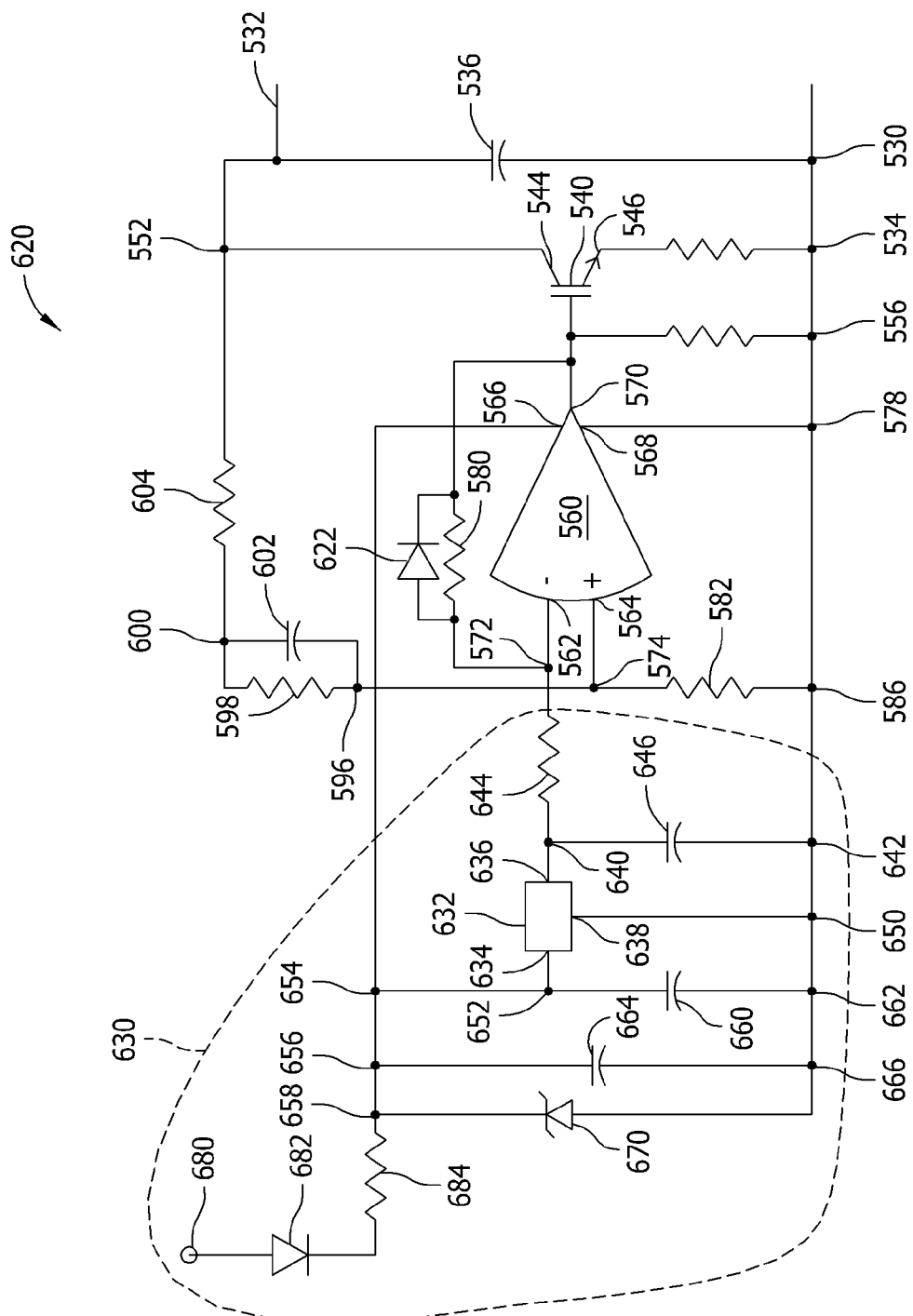
FIG. 8 is a schematic diagram of a temperature compensated voltage source that may be used with the switching circuit shown in FIG. 6.

FIG. 8 is a schematic diagram of an alternative temperature compensated voltage source 620. Components in temperature compensated voltage source 620 that are identical to components in temperature compensated voltage source 504 (shown in FIG. 7) are identified in FIG. 8 using the same reference numerals as used in FIG. 7. As compared to temperature compensated voltage source 504, in temperature compensated voltage source 620, a diode 622 is electrically coupled in parallel with third resistor 580. Further, a voltage supply circuit 630 illustrates one possible configuration of temperature compensated DC power source 610 (shown in FIG. 5). Unless otherwise noted, temperature compensated voltage source 620 operates substantially similar to temperature compensated voltage source 504.

Voltage supply circuit 630 includes a three-terminal voltage regulator 632. Voltage regulator 632 includes an input terminal 634, an output terminal 636, and a common terminal 638. Voltage regulator 632 may be a fixed output voltage regulator or an adjustable output voltage regulator (i.e., a voltage regulator in which the output voltage may be adjusted). Output terminal 636 is electrically coupled to a node 640 that is electrically coupled to node 572 and a node 642. A resistor 644 is electrically coupled between node 640 and node 572, and a first capacitor 646 is coupled between node 640 and node 642. In the exemplary embodiment, voltage regulator 732 functions as a temperature compensated voltage reference. Resistor 644, first capacitor 646, and second capacitor 660 provide voltage stability for voltage regulator 732.

Common terminal 638 is electrically coupled to a node 650 that is coupled to node 642. Further, input terminal 634 is electrically coupled to a node 652 that is in turn electrically coupled to a node 654. Node 654 is coupled to first supply voltage input 566 of op-amp 560, as well as node 656 and 658. A second capacitor 660 is electrically coupled between node 652 and a node 662 that is electrically coupled to node 650. A third capacitor 664 is electrically coupled between node 656 and a node 666 that is electrically coupled to node 662. A zener diode 670 is electrically coupled between node 658 and 666.

In the exemplary embodiment, a voltage input 680 is electrically coupled to voltage supply circuit 630 and supplies voltage for temperature compensated voltage source 620. More specifically, voltage input 680 is coupled to node 658 through a diode 682 and a resistor 684.

FIG. 8 illustrates a specific example of temperature compensated voltage source 406 (shown in FIG. 6). It should be noted that temperature compensated voltage source 620 is exemplary only and does not in any way limit the methods and systems described herein. That is, temperature compensated voltage source 406 may include any components and/or arrangement of components that facilitate reducing the effects of temperature drift in switching circuit 400.

Figure 9:
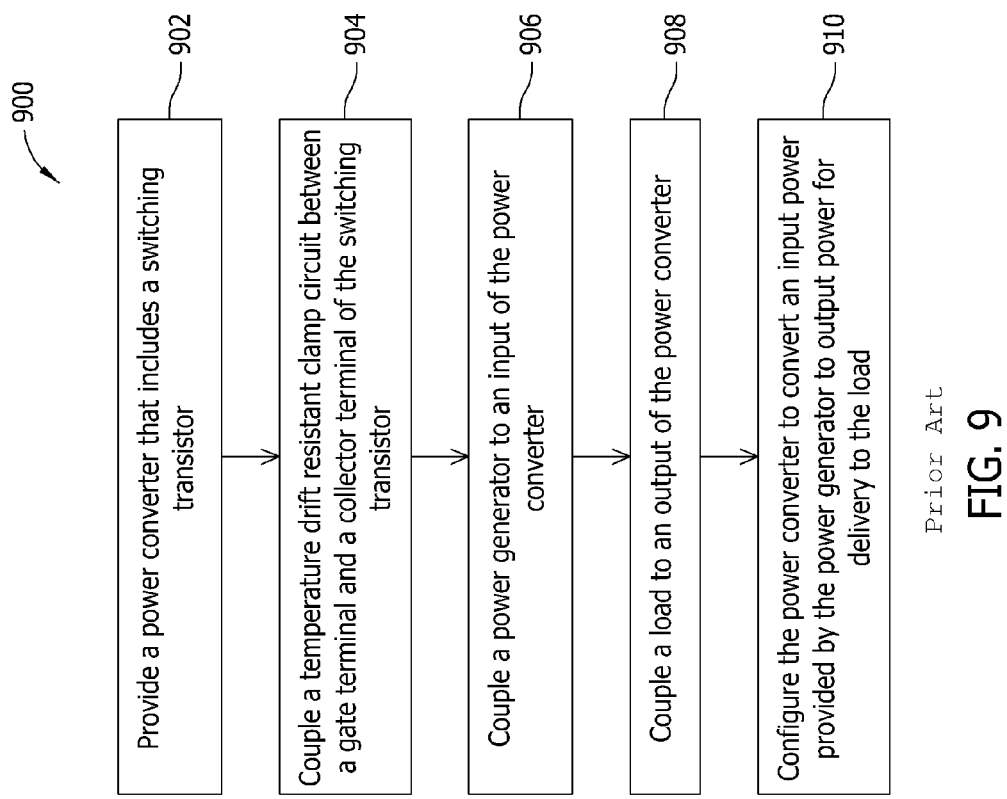
FIG. 9 is a flowchart of an exemplary method for providing an output power to a load.

FIG. 9 is a flowchart of an exemplary method 900 for providing an output power to a load. A power converter, such as power converter 12 (shown in FIG. 1) is provided 902. In the exemplary embodiment, power converter includes a switching transistor, such as IGBT 102 (shown in FIG. 3), that includes a gate terminal, a collector terminal, and an emitter terminal. A temperature drift resistant clamp circuit, such as temperature drift resistant clamp circuit 152, is electrically coupled 904 between the gate terminal and the collector terminal. In one embodiment, the temperature drift resistant clamp circuit includes at least one zener diode, such as zener diode 122 (shown in FIG. 4), and a temperature compensation circuit, such as temperature compensation circuit 204 (shown in FIG. 4). In another embodiment, the temperature drift resistant clamp circuit includes a backwards diode component, such as backwards diode component 404 (shown in FIG. 6), and a temperature compensated voltage source, such as temperature compensated voltage source 406 (shown in FIG. 6).

A power generator, such as generator 14 (shown in FIG. 1), is coupled 906 to an input of the power converter. Further, a load, such as load 16 (shown in FIG. 1) is coupled 908 to an output of the power converter. The power converter is configured 910 to convert an input power provided by the power generator to output power for delivery to the load.

The embodiments described herein utilize a temperature drift resistant clamp circuit to facilitate reducing the effects of temperature on operation of a power converter switching circuit. In one embodiment, the temperature drift resistant clamp circuit includes at least one zener diode and a temperature compensation circuit. In another embodiment, the temperature drift resistant clamp circuit includes a backwards diode component and a temperature compensated voltage source. As compared to known power converters, because the effects of temperature are reduced by using the temperature drift resistant clamp circuit, the switching circuit can be operated at a higher voltage, decreasing switching losses and increasing a total power output of the power converter.

Exemplary embodiments of a power generation system, a switching circuit, a temperature drift resistant clamp circuit, and a method for providing an output power to a load are described herein. The methods and systems described herein are not limited to the specific embodiments described herein, but rather, components of the systems and/or steps of the methods may be utilized independently and separately from other components and/or steps described herein. For example, the methods and systems described herein may have other applications not limited to practice with power converters. Rather, the methods and systems described herein can be implemented and utilized in connection with various other applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A switching circuit for use in a power converter, said switching circuit comprising:
    an insulated gate bipolar transistor (IGBT) comprising a gate terminal, a collector terminal, and an emitter terminal;
    a gate drive circuit electrically coupled to said gate terminal and configured to switch said IGBT on and off; and,
    a temperature drift resistant clamp circuit electrically coupled between said gate terminal and said collector terminal of said IGBT, said temperature drift resistant clamp circuit configured to maintain a voltage at said collector terminal below a threshold voltage and facilitate reducing the effects of temperature on operation of said switching circuit, wherein said temperature drift resistant clamp circuit comprises:
        at least one zener diode; and,
        a temperature compensation circuit electrically coupled to said zener diode and comprising at least one thermistor that compensates for a change in a breakdown voltage of said zener diode due to a change in temperature.

2. A power generation system comprising:
    a power generator; and,
    a power converter electrically coupled to said power generator, said power converter configured to convert power generated by said generator and supply the converted power to a load, wherein said power converter comprises at least one switching circuit that comprises:
        an insulated gate bipolar transistor (IGBT) comprising a gate terminal, a collector terminal, and an emitter terminal;
        a gate drive circuit electrically coupled to said gate terminal and configured to switch said IGBT on and off; and,
        a temperature drift resistant clamp circuit electrically coupled between said gate terminal and said collector terminal of said IGBT, said temperature drift resistant clamp circuit configured to maintain a voltage at said collector terminal below a threshold voltage and facilitate reducing the effects of temperature on operation of said switching circuit.

3. A system in accordance with claim 2, wherein said power converter is configured to convert a variable frequency alternating current (AC) input power to a fixed frequency output power.

4. A system in accordance with claim 2, wherein said power generator is a wind turbine generator.

5. A system in accordance with claim 2, wherein said temperature drift resistant clamp circuit comprises:
    at least one zener diode; and,
    a temperature compensation circuit electrically coupled to said zener diode.

6. A system in accordance with claim 5, wherein said temperature compensation circuit comprises at least one thermistor.

7. A system in accordance with claim 2, wherein said temperature drift resistant clamp circuit comprises:
    a backwards diode component; and,
    a temperature compensated voltage source electrically coupled to said backwards diode component.

8. A system in accordance with claim 2, wherein said temperature compensated voltage source comprises a direct current (DC) power source.

9. A method for reducing the effects of temperature on a switching circuit for use in a power converter, said method comprising:
    providing an insulated gate bipolar transistor (IGBT) including a gate terminal, a collector terminal, and an emitter terminal;
    coupling a gate drive circuit to the gate terminal, the gate drive circuit configured to switch the IGBT on and off; and,
    coupling a temperature drift resistant clamp circuit between the gate terminal and the collector terminal of the IGBT, the temperature drift resistant clamp circuit configured to maintain a voltage at the collector terminal below a threshold voltage and facilitate reducing the effects of temperature on operation of the switching circuit, the temperature drift resistant clamp circuit including a temperature compensation circuit and at least one zener diode in series.

10. A method in accordance with claim 9, further comprising coupling the switching circuit within a power converter configured to convert a variable frequency alternating current (AC) input power to a fixed frequency output power.

11. A method in accordance with claim 9, wherein coupling a temperature compensation circuit comprises coupling a temperature compensation circuit including a thermistor.

12. A method in accordance with claim 11, wherein coupling a temperature compensation circuit including a thermistor comprises coupling a temperature compensation circuit including a thermistor configured to compensate for a change in a breakdown voltage of the zener diode due to a change in temperature.

* * * * *